United States Patent [19]

Degani et al.

[11] Patent Number: 5,125,560
[45] Date of Patent: Jun. 30, 1992

[54] METHOD OF SOLDERING INCLUDING REMOVAL OF FLUX RESIDUE

[75] Inventors: Yinon Degani, Highland Park; Dean P. Kossives, Glen Gardener, both of N.J.

[73] Assignee: AT&T Bell Laboratories, Murray Hill, N.J.

[21] Appl. No.: 787,290

[22] Filed: Nov. 4, 1991

[51] Int. Cl.$^5$ .................. B23K 1/19; B23K 35/363
[52] U.S. Cl. .................. 228/223; 228/242; 228/175
[58] Field of Search .............. 228/175, 180.2, 207, 228/223, 242

[56] References Cited

U.S. PATENT DOCUMENTS 3,963,529 6/1976 Tsunashima .................. 228/223

OTHER PUBLICATIONS

IBM Technical Disclosure Bulletin, "Prefluxing Semiconductor Chips", vol. 21, No. 6, p. 2426, Nov. 1978.
IBM Technical Disclosure Bulletin, "Method of Purging Entrapped Flux Residues from Solder Joints", vol. 30, No. 7, p. 238, Dec. 1987.
Metals Handbook, Ninth Edition, vol. 6, pp. 1081–1085, "Fluxes", copyright 1983.
D. Shoenthaler, *Welding Journal Research Supplement*, Nov. 1974.

Primary Examiner—Samuel M. Heinrich
Attorney, Agent, or Firm—B. S. Schneider

[57] ABSTRACT

Soldering is performed and the residues associated with the soldering process are removed through the use of a specific process. Components such as two integrated circuits or an integrated circuit and mounting board are initially tacked by compression bonding or through the use of adhesives. Flux is introduced, and the components to be soldered are brought to reflow temperature. The flux is chosen so that upon reflow and subsequent cooling to a temperature of 100° C., or lower, the flux remains in liquid state. The flux is then easily removed by cleaning with a miscible liquid that is subsequently removed through processes such as spinning and evaporation.

6 Claims, 1 Drawing Sheet

5,125,560

METHOD OF SOLDERING INCLUDING REMOVAL OF FLUX RESIDUE

BACKGROUND OF THE INVENTION

1. Field of the Invention

This invention relates to soldering and, in particular, to processes involving soldering with a flux.

2. Art Background

The manufacture of a wide variety of electronic devices involve solder connection induced between small regions of solder generally denominated solder bumps. For example, solder bumps present on an integrated circuit chip are aligned with corresponding solder bumps on a substrate, e.g. on a second chip, on a ceramic substrate, or on a printed circuit board. The bumps, after alignment, are held temporarily in place by procedures such as compression bonding or through the use of an adhesive such as an epoxy adhesive. (See Bartschat, Electronic Components Conference, Los Angeles, p. 335, May 1988 for a description of compression bonding.) The flux is then introduced generally at room temperature. The flux includes a vehicle and a material suitable for dissolving or removing the oxides present on the solder bumps. The assembly is then brought to the reflow temperature, i.e., a temperature sufficient to melt the solder alloy and allow it to wet the metal surfaces contacting it, and the aligned bumps are allowed to coalesce. For devices where reliability is a significant consideration, any residue present from the flux after reflow is then removed.

A variety of methods for flux introduction are available for soldering conventional assemblies. For example, as described in D. Shoenthaler, *Welding Journal Research Supplement*, November 1974, the assembly is immersed in a flux bath heated to the reflow temperature. As a result, the flux is both introduced and provides the heat necessary for reflow. Alternatively, as described in N. G. Koopman, et al. in *Microelectronic Packaging Handbook*, R. R. Tummala and E. J. Rymaszewski eds Van Nostrand Reinhold, New York, N.Y. 1989, p. 380 and references cited therein, a relatively small amount of an essentially solid flux is introduced at the solder bump region and the entire assembly brought, for example, in a furnace, to reflow temperature.

In sophisticated electronic device configurations, these conventional processes have been considered not totally desirable. For example, for many assemblies a set of solder bump connections are made between two components and these combined components are then, through a second set of solder bump connections, soldered to a third component. Clearly, the first soldering procedure must include solder bumps that melt at a temperature significantly higher than that employed during the process of soldering the combination to the third component. Typically, the assembly is made by soldering the first interconnect at temperatures in excess of 240° C., and subsequently, soldering of the combination to a third component at approximately 180° C. Since most fluxes, such as rosin fluxes, decompose at the temperature required for the first soldering step, this first soldering step must be done in an inert ambient, e.g., a nitrogen ambient. However, use of such ambient generally does not prevent polymeric residues to remain after soldering and produces enormous cleaning problems.

Additionally, components are now often closely positioned so that the aspect ratio between components, i.e., the ratio between the distance from the edge of the component to the furthest removed boundary of solder bump divided by the smallest distance between the two components (respectively D and d in the Figure) is larger than 0.05. The length, i.e., 10 in FIG. 1, is also often quite large, exceeding 1.5 mm and the height, 20, is quite small, less than 150 μm. For such aspect ratios, heights and/or lengths, and particularly for aspect ratio greater than 0.1 and especially greater than 0.5, removal of flux residue is extremely difficult, and conventional methods are often considered inadequate for this task.

For high aspect ratios, for large lengths, and low heights as well as for high temperature processing, conventional fluxes presents significant difficulties in introducing and removing the flux and its residue. Similarly, the use of a liquid flux bath at high temperatures present significant fire hazards. These residues associated with conventional procedures are considered unacceptable risks to the lifetime of the device and interfere with subsequent coating and encapsulation. Thus, current procedures present processing shortcomings.

SUMMARY OF THE INVENTION

Removal of residues in procedures involving high temperatures, large lengths, small heights, and high aspect ratios is available by using a limited volume of liquid flux. In particular, a flux in the liquid state is introduced at the solder bumps to be joined at temperatures below 100° C. The amount of flux introduced is limited so that the desired reflow is producible by subjecting the assembly to a heat profile, e.g. a ramping profile, such that the time the assembly is at a temperature above 150° C. is less than ten minutes, preferably less than five minutes, most preferably less than two minutes. After reflow, the soldered assembly is brought to a temperature below 100° C. and the remaining liquid flux is removed by cleaning with a miscible liquid that allows removal through procedures such as evaporation and or spinning. Exemplary of suitable fluxes is a combination of a vehicle such as polyethylene glycol with an organic acid such as rosin or abietic acid. Removal of the flux after reflow is accomplished, for example, in the case of a polyethylene glycol vehicle by alcohol and water rinse or spray and through subsequent spinning.

BRIEF DESCRIPTION OF THE DRAWING

The FIGURE is indicative of concepts involved in the invention.

DETAILED DESCRIPTION

Figure 1:
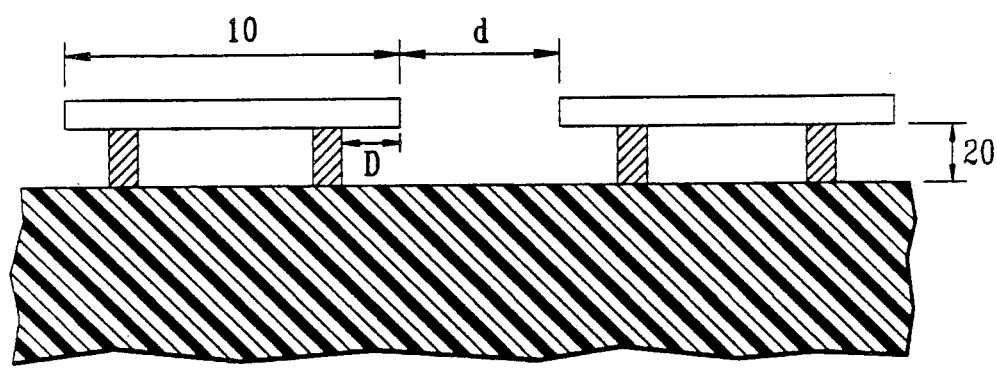

As discussed, the invention is particularly suitable for soldering configurations requiring reflow at relatively high temperature, i.e., temperatures above 280° C., and for configurations where aspect ratios greater than 0.05, and/or heights less than 150 μm, and/or lengths greater than 1.5 mm, are involved. However, the process is equally applicable for other configurations, and use in such situations is not precluded. Therefore, although for pedagogic purposes, the invention will be described in terms of such advantageous applications, the invention is not so limited.

Generally, the components to be soldered are initially aligned, and an expedient is employed to hold this alignment during subsequent reflow. Various expedients for adhesion have been employed. For example, the corresponding solder bumps on the components to be joined are initially held through compression bonding. Compression bonding involves the application at an elevated temperature of pressure to solder bumps that have been brought into contact. Typically, compression pressure in the range 20 psi to 50 psi are employed in conjunction with temperatures in the range 190° C. to 275° C. (See Bartschat supra for a complete description of compression bonding techniques.) Alternate methods of maintaining initial alignment include the use of adhesives such as epoxy adhesives. Generally, a small amount of epoxy is introduced onto one or both of the regions to be joined before initial alignment.

After initial alignment, the flux is introduced at a temperature below 100° C. The state of the flux upon introduction is not critical, but use of a material that is liquid upon introduction is preferable because of the ease of introduction. (A material in the liquid state for purposes of this invention is a material having a viscosity less than 15,000 centipoise as measured by a Brookfield viscometer.) The components to be soldered together with the flux is then elevated to at least the reflow temperature.

The composition of the flux is chosen so that during reflow and after reflow until the components are cooled to a temperature below 100° C., the flux remains in the liquid state. (It is acceptable and generally advantageous that the flux remain in the liquid state during the entire procedure including during subsequent cleaning.) The amount of flux applied should be sufficient to cover with liquid at reflow all surface immediately adjoining the sides of the device being connected and between regions having solder. Additionally, the flux volume should be limited so that the time the flux is at a temperature above 150° C. is limited to no more than ten minutes, preferably no more than five minutes, most preferably no more than two minutes.

The composition of the flux is not critical provided the previously described criteria are satisfied. Generally, the flux is composed of a vehicle and an acid. The vehicle is typically a liquid solvent, and the acid is chosen to produce removal of the oxide from the solder bump at reflow temperature. A wide variety of acids are available such as those described in copending application Ser. No. 07/724,561, filed Jun. 28, 1991. As discussed, the combination of vehicle and acid should be liquid at the reflow temperature and subsequent to reflow to a temperature of 100° C., preferably 50° C. or below. Generally, liquids with vapor pressures of less than 5 Torr at the reflow temperature satisfy this criterion. Exemplary of suitable vehicles are polyethylene glycol with molecular weight between 200 and 5000 grams/mole and soybean oil. Although the flux has been described in terms of a two-component mixture, single-component fluxes, or fluxes having three or more components, are not precluded provided the described criteria are satisfied.

By limiting the amount of flux employed, fire hazard is typically avoided. Similarly, by using a sufficient amount of flux to cover the solder bump region contrary to previous beliefs, the amount of flux residue is also severely limited. Thus, this residue is easily removed by conventional cleaning procedures. For example, a cleaning liquid is introduced that is miscible with the flux in its liquid state. (Miscible for the purposes of this invention is solubility higher than 5 weight percent.) The miscible cleaning liquid is chosen so that it is easily removable through processes such as spinning or evaporation. Typically, a combination of such processes is employed. For example, the solder assembly is spun at rates in the range 50 to 500 rpm and then allowed to dry at a temperature in the range 50 to 100° C., for 1 to 3 minutes. Through the use of this procedure, cleaning is expeditiously achieved even in high temperature techniques using components having a high aspect ratio, short height, and large lengths. The following examples are illustrative of conditions employable in the invention to achieve such results.

EXAMPLE 1

The flux was made by mixing 10 grams of abietic acid with 90 grams poly(ethylene glycol) molecular weight 400 in a glass beaker equipped with a magnetic stirring bar over a hot plate kept on 150° C.

Forty five silicon chips with solder bumps were placed onto a silicon substrate by thermal compression bonding (chip kept at 250° C. 35 psi pressure for seven seconds). The substrate with the chips was then put in an aluminum carrier and the flux was applied so that it just covered the sides of the chips. The carrier was then placed on a belt oven and was heated to 160° C. for one minute followed by 330° C. for one minute and then cooled to room temperature. The reflowed substrate thus had a multiplicity of semiconductor chips soldered through a compression bonding/reflow process to the end of runners. The aspect ratio of the various chips on the substrate ranged between 0.1 to 1.0. The height after reflow ranged from 50-75 microns and the length of the chips ranged from 1½ to approximately 5 mm.

For cleaning the substrate was placed on the sample holder of a commercially available wafer photoresist developer and rotated at a rate of 75 rpm. A solution formed of 25% by weight isopropyl alcohol, 25% methanol, and 50% by weight water was sprayed onto the substrate at an angle at approximately 45° to the major surface of the substrate at a rate of approximately 250 ml/min. This spraying continued for approximately 40 seconds, was discontinued, and replaced with a spray of water while the substrate spinning rate was increased to 100 rpm and maintained at this level for approximately 30 seconds. The spinning rate was then increased to 150 rpm and the isopropyl alcohol solution was sprayed for 30 seconds. This spray was then again replaced by a spray of deionized water which continued for 30 seconds. The spray was then discontinued and the substrate was spun at 200 rpm for 60 seconds. The substrate was then removed from the sample holder and subjected to a stream of nitrogen for drying whose pressure upon leaving the nozzle was approximately 40 psi.

EXAMPLE 2

A reflowed substrate similar to the one described in Example 1 was used as a sample for cleaning. The reflowed substrate was submerged for one minute into a room temperature water bath in which the water was circulated. After removing from the bath, the substrate was rinsed by a stream of isopropanol for 15 seconds, followed by a three minutes dip into an agitated isopropanol bath kept at 60° C. After removing from the bath, the substrate was dried by a nitrogen stream as described in Example 1.

We claim:

1. A process for producing a body comprising a plurality of devices soldered onto a substrate, said process comprising the steps of mating solder bumps making electrical contact to said devices with solder bumps making electrical contact to electrical conductors on said substrate, heating said bumps to a temperature that is sufficient to reflow said bumps, cooling said bumps, and cleaning any residue from said reflow step characterized in that a flux is introduced at a temperature below 100° C., said flux being liquid at said temperature for reflow wherein the amount of said flux is sufficient to cover the region of said bumps but said amount is limited so that the flux is at a temperature above 150° C. for less than ten minutes, and wherein there is satisfied at least one condition selected from the group consisting of A) the aspect ratio between at least two of said devices being larger than 0.05, B) the height of at least one of said devices above said substrate being less than 150 μm and C) the length of at least one of said devices being greater than 1.5 mm.

2. The process of claim 1 wherein said reflow temperature is 280° C. or more.

3. The process of claim 1 wherein said solder bumps are aligned by compression bonding.

4. The process of claim 1 wherein said flux comprises a solvent and an organic acid.

5. The process of claim 4 wherein said solvent comprises of poly(ethylene glycol) with molecular weight higher than 200 and lower than 5000.

6. The process of claim 5 wherein said organic acid comprises of abietic acid or rosin.

* * * * *